(12) United States Patent
Keil et al.

(10) Patent No.: US 7,717,693 B2
(45) Date of Patent: May 18, 2010

(54) MODIFIED METAL MOLD FOR USE IN IMPRINTING PROCESSES

(75) Inventors: Matthias Keil, Malmö (SE); Göran Frennesson, Lund (SE); Marc Beck, Malmö (SE); Babak Heidari, Furulund (SE)

(73) Assignee: Obducat AB, Malmo (SE)

( * ) Notice: Subject to any disclaimer, the term of this patent is extended or adjusted under 35 U.S.C. 154(b) by 0 days.

(21) Appl. No.: 11/597,570

(22) PCT Filed: May 27, 2005

(86) PCT No.: PCT/EP2005/052423

§ 371 (c)(1),
(2), (4) Date: Nov. 27, 2006

(87) PCT Pub. No.: WO2005/119360

PCT Pub. Date: Dec. 15, 2005

(65) Prior Publication Data

US 2007/0166557 A1    Jul. 19, 2007

Related U.S. Application Data

(60) Provisional application No. 60/521,587, filed on May 28, 2004.

(30) Foreign Application Priority Data

May 28, 2004   (EP) .................................. 04445064

(51) Int. Cl.
*B29C 59/00* (2006.01)
*B29C 33/56* (2006.01)
*B28B 7/38* (2006.01)

(52) U.S. Cl. ..................... 425/385; 249/115; 106/38.22

(58) Field of Classification Search .................. 425/385; 427/135; 106/38.22; 249/115

See application file for complete search history.

(56) References Cited

U.S. PATENT DOCUMENTS

| 3,972,924 | A | * | 8/1976 | Chance et al. ............... 562/811 |
| 4,118,235 | A |   | 10/1978 | Horiuchi et al. |
| 5,277,788 | A |   | 1/1994 | Nitowski et al. |
| 5,804,674 | A |   | 9/1998 | Yamana et al. |

(Continued)

FOREIGN PATENT DOCUMENTS

WO    WO 00/00868    1/2000

(Continued)

*Primary Examiner*—Maria Veronica D Ewald
(74) *Attorney, Agent, or Firm*—Renner, Otto, Boisselle & Sklar, LLP

(57) ABSTRACT

The invention relates to a novel metal mold having anti-adhesive properties comprising a base metal mold and an anti-adhesive layer comprising a fluorinated alkyl phosphoric acid derivative or a fluorinated alkyl poly-phosphoric acid derivative, including a phosphorous atom and an alkyl chain. The anti-adhesive layer is bonded directly onto a surface of the base metal mold. The base metal mold may be e.g. Nickel, and said fluorinated alkyl phosphoric acid derivative or said fluorinated alkyl poly-phosphoric acid derivative may be selected from the group consisting of phosphonic acids, phosphonic acids, phosphonates and phosphonate salts, phosphonates and phosphonate salts, or their respective oligomers, such that the phosphorous atom is coupled directly to the alkyl chain, such that the phosphorous atom is coupled directly to the alkyl chain.

11 Claims, 10 Drawing Sheets

U.S. PATENT DOCUMENTS

| | | | |
|---|---|---|---|
| 6,048,623 A | 4/2000 | Everhart et al. | |
| 6,824,882 B2 * | 11/2004 | Boardman et al. | 428/457 |
| 6,923,930 B2 * | 8/2005 | Ling et al. | 264/293 |
| 2002/0130441 A1 | 9/2002 | Robinson et al. | |

FOREIGN PATENT DOCUMENTS

| | | | |
|---|---|---|---|
| WO | WO01/53889 | * | 7/2001 |
| WO | WO 2004/000567 | | 12/2003 |

* cited by examiner

MODIFIED METAL MOLD FOR USE IN IMPRINTING PROCESSES

CROSS REFERENCE TO RELATED APPLICATIONS

This application is a national phase application based on PCT/EP2005/052423, filed May 27, 2005, and claims the priority of European Patent Application No. 04445064.1, filed on May 28, 2004, and the benefit of U.S. Provisional Application No. 60/521,587, filed on May 28, 2004, the contents of which all of which are incorporated herein by reference.

FIELD OF INVENTION

The present invention relates to modified metal molds having improved anti-adhesive properties for use in nano-imprinting processes.

BACKGROUND

It is necessary to provide a non-sticking interface between a nano-structured master and the polymer to be embossed in the replication of nano-structures by imprinting processes, such as hot embossing. This allows demolding without degrading the replication fidelity. Adhesion during the mold release may cause damage to the replica. Further, residual polymer structures may contaminate the surface of the mold. A prerequisite for a successful imprint process is that the mold used should be chemically and mechanically stable and should also adhere poorly to polymers such that sticking to the mold is avoided.

During the last years a lot of effort has been made to minimize the adhesion forces at the stamp/polymer interface in nano-imprint lithography [1-3] mainly with the establishment of thin fluorinated films deposited onto the stamp surfaces [4-7]. These anti-sticking films lead to the reduction of surface energy of the stamps and improve the release of the stamp from the imprinted polymer. It is well known that for gold surfaces, the adsorption of fluorinated alkyl thiol self-assembled monolayer (SAM) films leads to both highly hydrophobic and lipophobic surfaces demonstrating contact angles with water of 120° and with hexadecane of 81° [8]. U.S. Pat. Nos. 5,512,131 and 6,380,151 disclose the use of SAM forming species as part of a method of patterning a material surface for use in microelectronic and optoelectronic applications. Neither of these patents however, utilise the SAM films for the purpose of reduction of adhesive forces.

When addressing the reduction of adhesive forces, two alternative solutions presently show promise. The first alternative involves the deposition of polytetrafluoroethylene (PTFE) films onto structured stamps with the help of a $CF_4/H_2$ or $CBF_3$ plasma [4]. In this case, the polymer is only bound weakly to the substrate and the film has to be renewed after a few imprints in order to maintain the imprint quality. The second alternative involves the formation of anti-sticking films of fluorinated alkyl silanes using chemical vapour deposition possessing film thicknesses in the monomolecular region [5-7]. The direct chemical bond of the silane groups, especially for silicon stamps, with the substrate surfaces results in good imprint results of patterns with feature sizes down to 20 nm [5].

From the literature it is also known that alkyl phosphate salts, alkyl phosphoric acids, and alkyl phosphonic acids produce well-ordered self-assembling monolayers on oxidized surfaces of aluminium, tantalum, niobium, zirconium, and titanium taking advantage the strong ionic linkage between the phosphate group and the oxidized metal surface [9-13]. After heating of the samples, the films demonstrate a strong resistance against mechanical force as well as chemical stability against solvents [14]. Also fluorinated alkyl phosphoric acid derivates have been recently deposited onto oxidized aluminium and alumina surfaces [15,16].

With regards to substrates, the application of polycrystalline nickel sheets instead of silicon wafers as stamp materials may be regarded as an industrially more relevant alternative. Nickel (Ni) stamps are commonly used in several industrial applications of nano-imprint lithography (NIL).

Ni especially may be regarded as a highly suitable material for the preparation of phosphoric acid based surfactants in an industrially relevant process. The ionic nature of Ni-oxide increases the possibility of an ionic linkage between the phosphate group and the Ni stamp surface without the application of additional adhesion promoters, allowing imprints of patterns with feature sizes down to 100 nm. The ionic nature of the Ni-oxide surface is thus considered suitable for the application of acid-based surfactants or surface modification agents while discouraging the use of silane agents, which in their turn, are more applicable when silicon stamps or silicon substrate surfaces are used [5, 17-19].

WO 2004/000567 A1 discloses anti-sticking films deposited on Ni stamps, used in nanoimprint lithography. Phosphate groups are among others used as linkage groups to metal films (Ti, Zr, Nb, Ta, Al and a mixture thereof) deposited as adhesion promoters onto Ni stamps (claims 3, 2, 10).

PROBLEM

Different performed imprint tests and spectroscopic investigations have demonstrated that anti-sticking layers adsorbed on Ni stamps that are composed of alkyl esters of phosphoric acids or phosphates—having an O bridge in-between the phosphorous atom and the alkyl chain as in FIGS. 1A and 1B—are not optimum to withstand an industrial imprint process of some thousands of imprints. Moreover, storage of the stamps—i.e. the exposure of Ni stamps with air humidity for a long time—will additionally reduce the lifetime of those stamps. The reason for this is mainly that the heating-cooling cycles in air humidity will continuously reduce the quality of the anti-sticking film. This behavior is strongly caused by modifications within the Ni oxide/hydroxide surface layer. The oxidized/hydroxidized Ni surface layer is a highly complex system in case of both corrosion and catalytic activities [26,27,28,29]. The layer is predominantly composed by NiO or $Ni^{2+}$, $Ni_2O_3$ or $Ni^{3+}$, $Ni(OH)_2$ and NiO(OH) [26,27], partially weakly bound to the Ni surface. NiO is the most common and stable Ni oxide whereas $Ni_2O_3$ are often called as lattice defects within the NiO lattice. These lattice defects can be regarded as the origin of catalytic reactions of nickel oxide [26,27]. NiO(OH) can be considered as an unstable intermediate within a reaction $Ni(OH)_2 \rightarrow NiO$ under desorption of hydroxides [26].

In particular, heating of the Ni stamps will initiate the desorption of OH or O or H containing species/radicals from the oxidized/hydroxidized Ni surface, having the capacity to break bonds within the phosphate/phosphoric acid based anti-sticking molecule. Here, species means: atoms, molecules and/or dissociatively generated clusters of atoms which can be charged or neutral. Cooling in air humidity will lead to the growth of a new oxide/hydroxide layer due to the chemisorption of $H_2O$ and oxygen from the air (see discussion below). Different examples of heterogeneous catalysis of oxidized Ni with $H_2O$ producing highly reactive gases are well known from the literature [26]. $H_2O$ exposure—i.e. storage in air humidity—in connection with surface lattice defects results in similar reactions as described above [26,27]. Therefore it is most probable that chemical modifications of the oxidized Ni stamp substrate are the reasons for the problems of the reliability and durability of anti-sticking films comprising phosphates or phosphoric acids.

In the course of our X-ray photoelectron spectroscopy (XPS) investigation desorptions and damages of $F_8H_2$-PS films adsorbed on oxidized Ni surfaces could be observed after thermal annealing at already relative low temperatures in UHV (150-200° C.). $F_8H_2$-PS: Heptadecafluoro(1H,1H, 2H,2H-tetrahydro)decyl-monophosphate $(CF_3-(CF_2)_7-CH_2)_2-O-P(O)-O_2^{2-}+2NH_4)$. In particular, after heating to 150° C. some amount of the $F_8H_2$-PS film has been desorbed from the surface, whereas the chemical composition of the fluorinated alkyl phosphate film does not change significantly. The removal of some amounts of the anti-sticking film is most probably related to the conversion from $Ni_2O_3$ and/or Ni hydroxides to NiO of the oxidized/hydroxidized Ni surface that has been observed at the same temperature. Strong damages within the fluorinated alkyl phosphate molecules occur after heating to 200° C. At that temperature 70% of fluorinated alkyl chains are removed from the surface. The most of the anti-sticking film is certainly destroyed. The growth of the C—O, C—H and F containing species on the stamp surface at 200° C. can be interpreted as a dissociation of fluorine from the CF-chains according to the formula: $CF_3 \rightarrow CF_2 \rightarrow CF \rightarrow C$ (such reactions are known in photo-dissociation of fluorinated alkyl silanes on Ti when the molecules are exposed to weak X-ray light [28]).

In recapitulation of the XPS investigation it can be concluded that due to heat treatment, bonds within the molecule could be destroyed quite easily, whereas the ionic P—O—Ni linkage between the $F_8H_2$-PS molecule and the Ni substrate surface has been observed to be quite stable. This behaviour is strongly correlated to properties and modifications of the Ni oxide/hydroxide layer, because $F_8H_2$-PS molecules—not adsorbed on a surface—demonstrate thermal stabilities up to 230° C. At that temperature the molecules could be sublimated in vacuum without observed modification within the molecular structure investigated by NMR (nuclear magnetic resonance).

It is most probable that the reduced decomposition temperature of the $F_8H_2$—PS films adsorbed on oxidized Ni is particularly caused by $OH^-$ radicals or $H_2O_2$ molecules or other OH containing species removing from the surface at low temperatures followed by the desorption of oxygen at higher temperatures [26]. These species will react with moieties of the $F_8H_2$-PS molecules and destroy the molecules. However, the exposure with air humidity will regenerate the oxidized/hydroxide Ni surface due to the adsorption of $H_2O$ and oxygen from the air environment, so that heating-cooling-cycles will create a continuative decomposition process. The XPS measurements demonstrate that the $F_8H_2$-PS film is damaged in a similar way as already observed in X-ray beam induced damages of fluorinated alkyl silanes adsorbed on oxidized Ti surfaces due to photo-generated electrons escaping from the oxidized metal [28]. So it can be assumed that the adsorbed $F_8H_2$-PS molecules can maybe be damaged by charged radicals or highly reactive molecules escaping from the oxidized Ni surface in a similar way as observed for adsorbed fluorinated alkyl silanes exposed by photo-generated electrons.

SUMMARY OF THE INVENTION

The cyclic loading of the stamp material to high mechanical and thermal stress occurring in an industrial imprint process—as well as the storage of the stamps in air humidity for a couple of weeks—will lead to similar degradation effects as those discussed above. The huge number of imprints performed by industrially capable equipments requires high reliability and durability—i.e. corrosion, aging and wear resistance—of stamp surfaces.

With this object at hand, the inventor has provided a way to improve corrosion, aging and wear resistance of stamp surfaces by modifying the anti-sticking molecules. It has been found that phosphoric acid or phosphate alkyl ester molecules—having an O bridge in-between the phosphorous atom and the alkyl chain—do not offer resistance to acids and additionally they do not offer resistance to oxygen and hydrogen containing species or radicals, as for example OH— and/or $H_2O_2$ desorbing from the oxidized Ni surface. According to the inventor's findings, the moiety of the molecule demonstrating the lowest stability is the oxygen bridge of the P—O—C unit, which has a tendency to brake after interactions with such radicals desorbing from the surface. It is therefore proposed to use other phosphoric acid derivatives as for example alkyl phosphonic/phosphonic acids or alkyl phosphonates/phosphonates, which lack such an O bridge. Here, the carbon atom of the alkyl chain is directly linked to the phosphorous atom, which will lead to a more stable anti-sticking film.

Additionally, also the CH2/CF2 linkages of the F8H2-PS molecule can be attacked by reactive species. As an alternative embodiment, it could therefore be suggested to bind the CF2 unit directly to the phosphorous atom without using a (CH2)m spacer in between the phosphorous atom and the (CF2)n chain or chains.

In the present invention, the deposition of derivatives of fluorinated alkyl phosphoric acids, or fluorinated alkyl polyphosphoric acid derivatives, often involving a chemical reaction with the surface of the mold, was found to be successful on Ni stamps and to result in better anti-adhesion or anti-stick layers than PTFE or fluorinated alkyl silane films presently used. The wear resistance is better than for PTFE films, and silanes do not bind to Nickel, or to most metal oxides, wherefore an adhesion promoter is required over the Nickel base in that case.

The invention provides a modified metal mold having an anti-adhesive layer comprising a fluorinated alkyl phosphoric acid derivative, which provides anti-adhesive properties. Some of the derivatives are shown in FIG. 1. The nomenclature of the different phosphorous containing compounds used in this application is based on the molecular structures shown in FIG. 1. The term "phosphoric acid derivatives" means all compounds displayed in FIG. 1 suitable for the establishment of anti-sticking films on oxidized/hydroxidized metal surfaces. These derivates include: phosphoric acid alkyl esters (displayed in FIG. 1A), phosphate—or phosphate salt—alkyl esters (displayed in FIG. 1B), alkyl phosphonic acids (displayed in FIG. 1C, left), alkyl phosphonic acids (displayed in FIG. 1C, right), alkyl phosphonates or alkyl phosphonate salts (displayed in FIG. 1D, left), and alkyl phosphonates or alkyl phosphonate salts (displayed in FIG. 1D, right).

The base mold metal used may be nickel, vanadium, aluminium, tantalum, niobium, zirconium, titanium, an alloy of two or more metals, and in oxidised form. The metal mold may further comprise one or more additional metal layers over the base mold metal.

The invention further provides a process for obtaining a modified metal mold having anti-adhesive properties by a deposition method comprising deposition of a selected fluorinated alkyl phosphoric acid derivative or a selected fluorinated alkyl poly-phosphoric acid derivative from (a) solution, and/or (b) from the vapour phase, and/or (c) from a supercritical fluid phase, onto the mold metal.

BRIEF DESCRIPTION OF THE DRAWINGS

FIG. 8 shows the AFM image of the third imprint of (a) a blue-ray DVD stamp in PMMA50 kC6 from Micro Resist Technology GmBR, Germany, (b) the same blue-ray DVD stamp after 5 imprints with the parameters of FIG. 8a;

DEFINITIONS

The term "nano-imprinting process" as used herein refers to a process for the creation of an inverted copy of a nano-structured stamp pattern, which is generated by pressing the stamp into a polymer in order to deform the polymer. The polymer may either be heated-up above its glass transition temperature followed by cooling-down to below said glass transition temperature during the imprinting (eg., hot embossing) process. Alternatively, the polymer may be cured with the help of UV-light exposure during or after the imprinting process.

The term "nano-imprint lithography" as used herein refers to the entire process for the replication of a nano-structured pattern. The process includes both the production of the stamp provided with an anti-sticking layer, the imprint, and the post-processing, for example, the transfer of the imprinted pattern by etching, metallization and lift-off.

The term "nano-structured master" or "stamp" refers to any patterned material suitable for effecting the transfer of the pattern by the mentioned nano-imprinting process.

The term "replication fidelity" refers to the creation of an inverted copy of the stamp structure in which the inverted topography of the stamp surface is completely reproduced.

The term "deposition" as used in the context "deposition of the anti-adhesive layer" may be used interchangeably with "preparation" or "establishment". The term also infers a chemical reaction (of the fluorinated compounds comprising the anti-adhesive layer) with the metal mold.

The term "anti-adhesive" as used herein may be used interchangeably with the term "anti-sticking".

DETAILED DESCRIPTION OF THE INVENTION

The invention provides a modified metal mold having anti-adhesive properties comprising a metal mold and an anti-adhesive layer comprising a fluorinated alkyl phosphoric acid derivative, such as a phosphoric acid, a phosphate or phosphate salt, a phosphonic acid, a phosphonate or phosphonate salt. Flourinated alkyl poly-phosphoric acid derivatives, i.e., oligomers of the above named compounds, may also be used.

Figure 1:
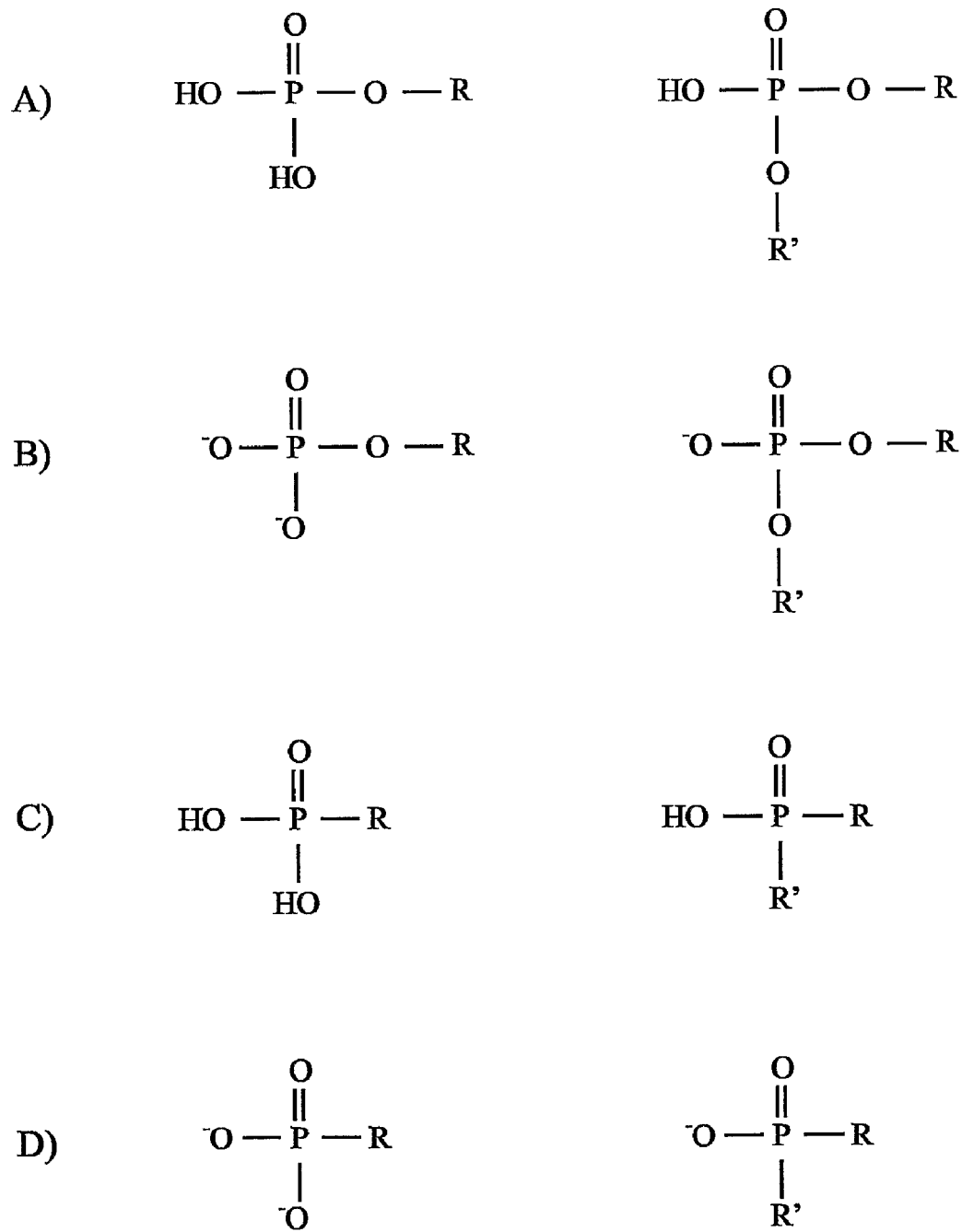
FIG. 1 shows some phosphoric acid derivatives suitable for the establishment of anti-stick films on oxidized metal surfaces.

FIG. 1 shows some of the different phosphoric acid derivatives suitable for the establishment of anti-sticking films on oxidized metal stamp surfaces. The derivatives shown in FIG. 1 include the groups: (A) phosphoric acid alkyl esters; (B) phosphate—or phosphate salt—alkyl esters; (C, left) alkyl phosphonic acids; (C, right) alkyl phosphonic acids; (D, left) alkyl phosphonates or alkyl phosphonate salts; and (D, right) alkyl phosphonates or alkyl phosphonate salts. The substituent groups, R, and R' are linear or branched alkyl residues, which are partly or per-fluorinated. The residues may be aliphatic or aromatic. In the case of the double substituted phosphoric acids, one of the residues may be non-fluorinated and/or consist of a single atom.

Figure 2A:
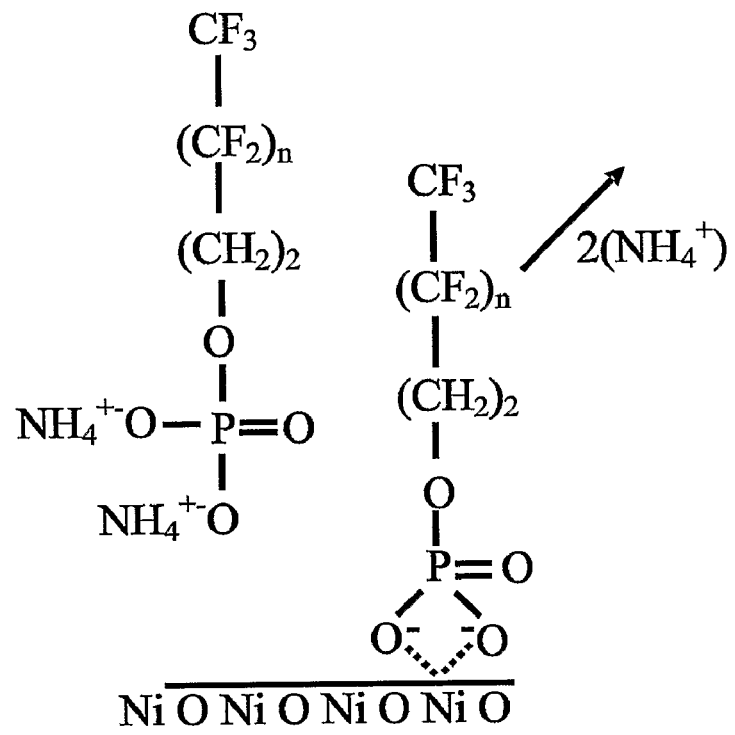
FIG. 2 shows the idealized binding mechanisms, established by [11], between (a) a fluorinated alkyl phosphate diammonium salt and (b) a fluorinated alkyl phosphoric acid, with an oxidised Ni stamp surface.
Figure 2B:
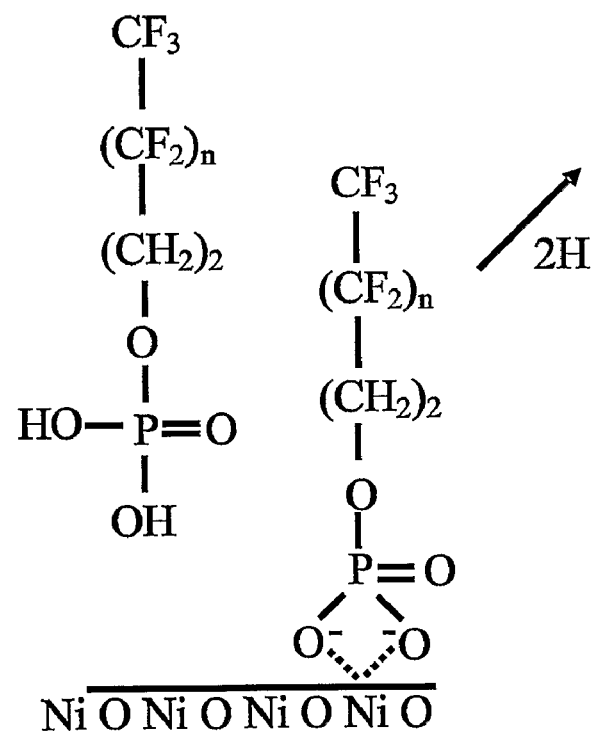

The anti-adhesive layer is expected to be firmly bonded to the surface of the metal mold. FIG. 2 shows the idealized binding mechanisms between (a) a fluorinated alkyl phosphate diammonium salt and (b) a fluorinated alkyl phosphoric diacid, with an oxidised Ni stamp surface [11].

The other phosphoric acid derivatives displayed in FIG. 1 are believed to exhibit similar binding mechanisms to the oxidised Ni surface as those displayed in FIG. 2.

The base mold metal used may be nickel, vanadium, aluminium, tantalum, niobium, zirconium, titanium, an alloy of two or more metals, and may be in oxidised form. The metal mold may further comprise one or more additional metal layers over the base mold metal.

The molecular structure of the surface species and bonds have been characterized using X-ray photoelectron spectroscopy (XPS) and are further described in the section entitled "Surface properties of the anti-adhesive film layer through characterization by X-ray photoelectron spectroscopy (XPS) and atomic force microscopy (AFM)" below. FIGS. 3-7 display the XPS results, and show evidence of strong bonding of the anti-adhesive compounds to the substrates.

The invention further provides a modified metal mold having anti-adhesive properties obtainable by a deposition method comprising deposition of a selected fluorinated alkyl phosphoric acid derivative or a selected fluorinated alkyl poly-phosphoric acid derivative from (a) solution, and/or (b) from the vapour phase, and/or (c) from a supercritical fluid phase, onto the mold metal.

The employment of one embodiment of (a), where the anti-adhesive layer comprising these derivatives may be prepared with the help of simple wet chemistry from aqueous solution, is desirable from two different aspects. Firstly, the nickel stamps can be cleaned of organic materials with the help of an inorganic water-based cleaning procedure and exposed to the phosphate solution without any air contact. This results in very pure films and avoids the application of time consuming vacuum technology. Secondly, the strong hydrophilic nature of clean oxidized Ni supports wetting of the whole surface including the nano-structured regions of the sample and guaranties a uniform coverage of the adsorbed phosphoric acid film over the whole surface.

The invention also provides a modified metal mold having improved anti-adhesive properties for use in a nano-imprinting process, such as nano-imprint lithography. The success of the molds in giving rise to well-defined imprints during nano-imprinting are made evident by the AFM pictures shown in FIGS. 8-11, which show the perfection of the imprints resulting from the use of the molds having improved anti-adhesive properties. These results are discussed in detail in the section, "Surface properties of the anti-adhesive film layer through characterization by X-ray photoelectron spectroscopy (XPS) and atomic force microscopy (AFM)" below.

In a further aspect, the invention provides anti-adhesive compounds comprising at least one fluorinated alkyl phosphoric acid derivative, such as a phosphoric acid, a phosphate salt, a phosphonic acid and a phosphonate or phosphonate salt, or else at least one fluorinated alkyl poly-phosphoric acid derivative. The molecular structure of some of the former derivatives are shown in FIG. 1.

Surface Properties of the Anti-Adhesive Film Layer through Characterization by X-ray Photoelectron Spectroscopy (XPS) and Atomic Force Microscopy (AFM)

X-ray photoelectron spectroscopy (XPS) has been used to characterize the surface properties of the different fluorinated alkyl phosphoric acids based anti-adhesive films, i.e. their thicknesses, chemical compositions, and binding mechanisms.

Three different compounds of fluorinated alkyl phosphoric acids were used:
1) A blend of fluorinated mono- and dialkyl phosphates diammonium salts with different chain lengths ($F_nH_2$-PS).
2) Heptadecafluoro(1H,1H,2H,2H-tetrahydro)decyl-monophosphate ($F_8H_2$-PS),
3) Heptadecafluoro(1H,1H,2H,2H-tetrahydro)decyl-monophosphoric acid ($F_8H_2$-PA).

As substrates for the XPS investigation of the fluorinated compounds we have used both non-patterned and patterned regions of electroplated, polycrystalline and oxidized Ni sheets as well the same substrates comprising an approx. 100 nm thick oxidized nickel—vanadium (Ni—V) alloy film on the surface having a V/Ni ratio of 0.07. For the imprint investigations using AFM, both Ni stamps and Ni stamps possessing a Ni—V surface as described above, were used.

Model Compounds

In addition to the fluorinated compounds, some model compounds, which were non-fluorinated derivatives, were also investigated with XPS. These were:
4) 1-octylphosphonic acid ($H_8$-PA) and
5) monododecyl ester phosphoric acid ($H_{12}$-PA)

For these experiments, a 1 nm thick Ti film was first deposited onto the silicon surface directly before Ni deposition to function as an adhesion promoter. The samples were cleaned by an organic and inorganic washing procedure described in the section "Specific description of the experiments" and transferred into a 1 mM solution in MilliQwater without surface exposure to air. The incubation time was approx. 10 hours. Afterwards the samples were rinsed with MilliQwater for 5 min and dried in a gentle stream of Nitrogen.

Figure 6:
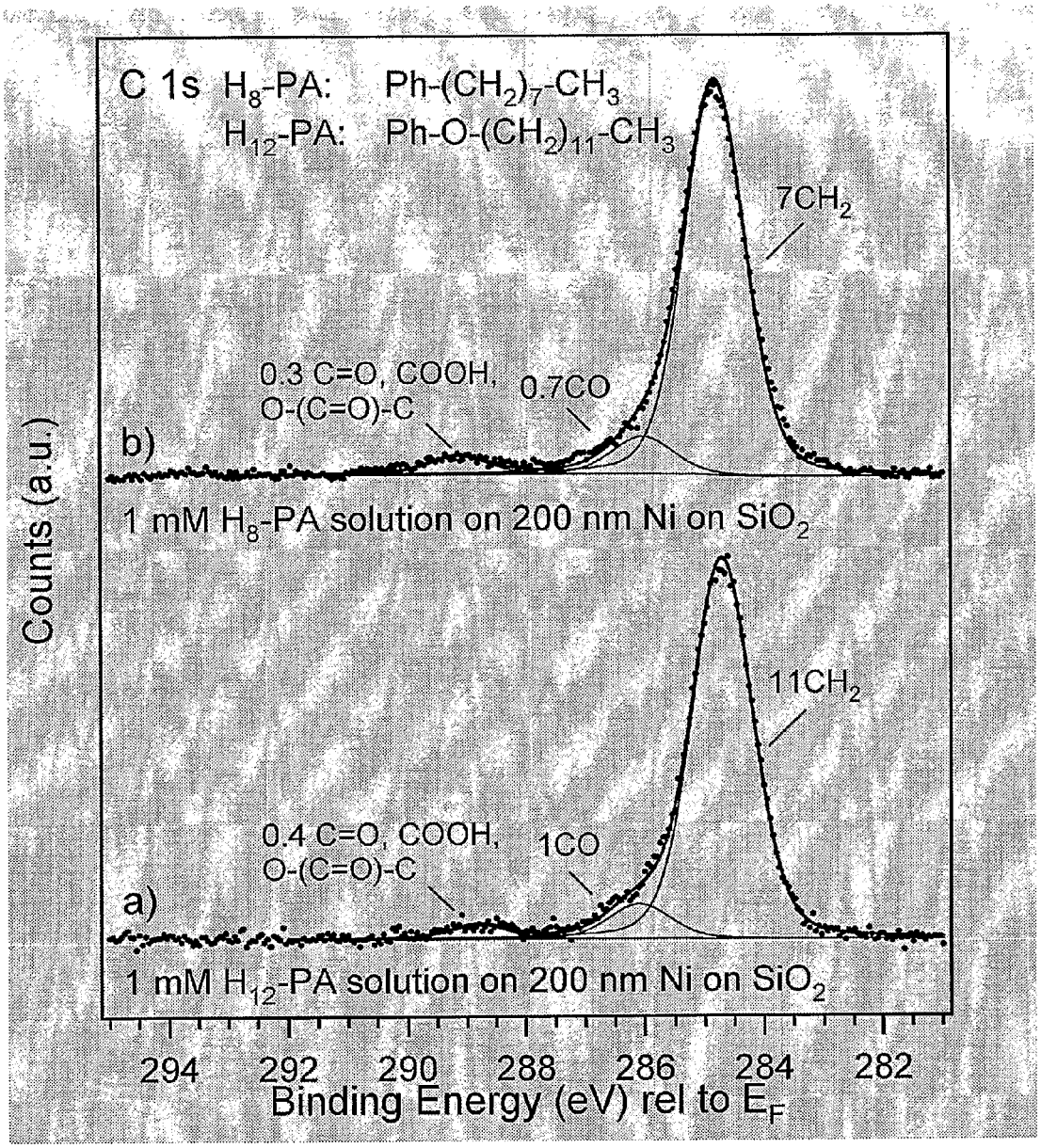
FIG. 6 shows the XPS C 1s spectra of a very pure monomolecular (a) $H_{12}$-PA film and of (b) $H_8$-PA films deposited on 2000 Å Ni on a Si(100) wafers.

The model compounds were observed to adsorb as very pure self-assembling monolayers onto thin, atomically flat and highly clean oxidized Ni films (200 nm thick, thermally deposited onto Si(100) wafers), and were shown to exhibit similar chemical behaviour with the oxidized substrate surfaces as observed for fluorinated mono- and dialkyl phosphate di-ammonium salts, the fluorinated mono-alkyl phosphoric acids, and the fluorinated mono-alkyl phosphate diammonium salts, also forming highly pure films with monomolecular thicknesses on the NiO substrate (See FIG. 6).

XPS Results

Figure 3:
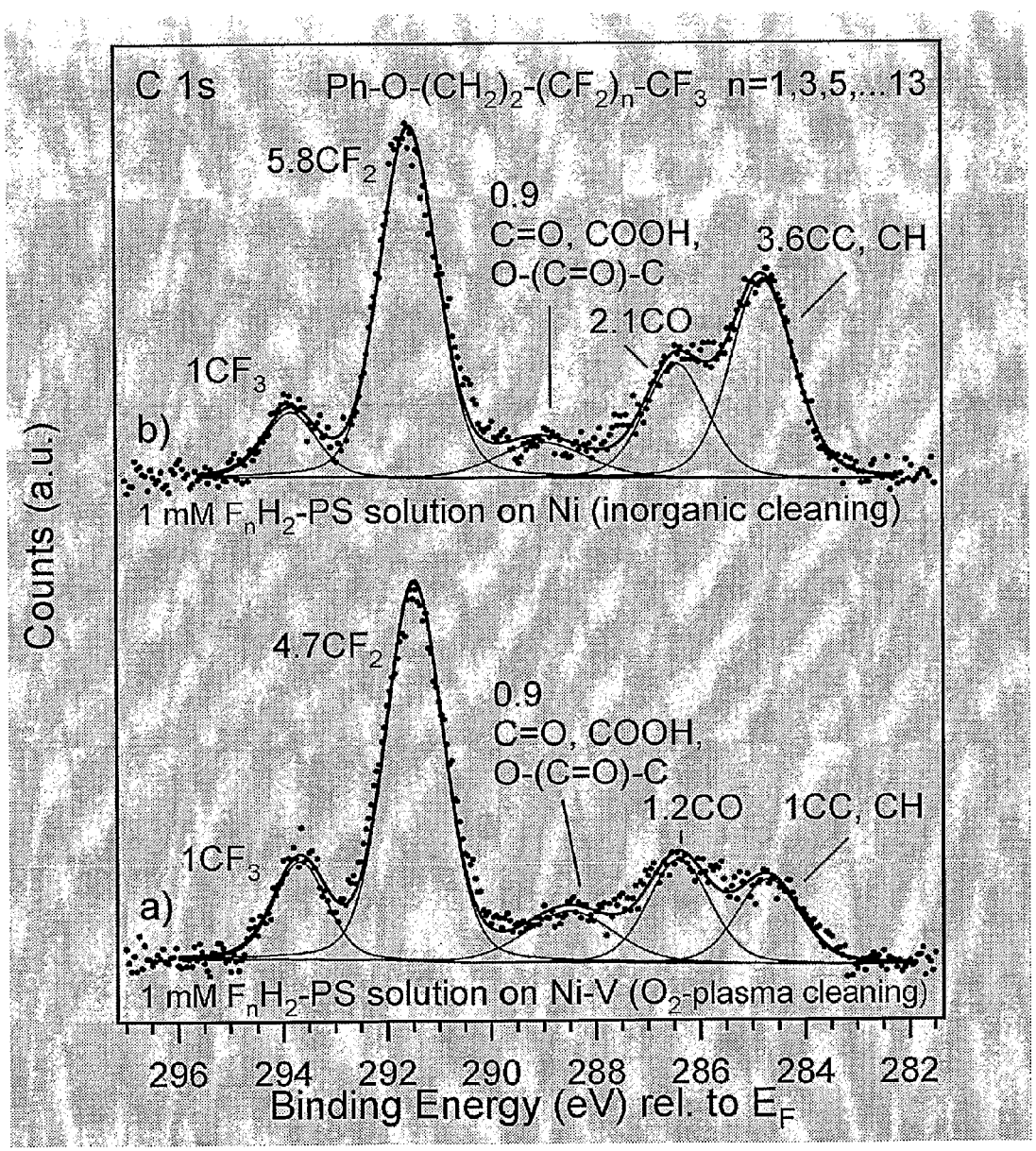
FIG. 3 shows the XPS C 1s spectra together with a Voigt function deconvolutions of very pure monomolecular $F_nH_2$-PS films deposited on electroplated non-patterned Ni and Ni—V sheets.

FIG. 3 shows the XPS C 1s spectra together with Voigt function deconvolutions of very pure monomolecular $F_nH_2$-PS films deposited on electroplated non-patterned Ni sheets. More specifically, these Ni sheets were (a) an oxidized Ni—V surface cleaned by an organic washing procedure (trichloroethylene, acetone and isopropanol, each treated for 5 min in an ultrasonic bath) followed by an oxygen plasma cleaning ($O_2$ gas plasma (50 mbar, 100 Watts, 60 sec) and (b) an oxidized Ni surface cleaned by the same organic washing procedure followed by an inorganic washing procedure (aqueous solution comprising MilliQwater, hydrogen peroxide and ammonia for 10 min at 80° C.)

All washing procedures are disclosed in the section "Specific description of the experiments". The film thicknesses of the film of FIG. 3a ($O_2$ plasma cleaned) can be estimated to be 10-16 Å and the one of FIG. 3b (cleaned by inorganic washing procedure) can be estimated to be 8-14 Å, estimated from the attenuation of the Ni $2p_{3/2}$ signal (not shown here) due to the adsorbed film (the procedure is described in [6,7]. The deconvolution of the C1s spectra of FIG. 3 leads to five peaks for each spectrum which can be assigned to the $CF_3$ end groups of the $F_nH_2$—PS molecules (at 293.7 and 293.8 eV for spectrum a and b, respectively), to the $CF_2$ chain of the $F_nH_2$-PS molecules (291.4 and 291.5 eV for spectrum a and b, respectively), to C=O, COOH or O—(C=O)—C containing impurity species (at 288.5 and 288.9 eV for spectrum a and b, respectively), to the CO group of the $F_nH_2$-PS molecules plus CO containing impurity species (at 286.4 for both spectra), and to the CC group of the $F_nH_2$-PS molecules plus CC or CH containing impurity species (at 284.7 and 284.8 eV for spectrum a and b, respectively). The spectra are normalized against the area of the $CF_3$ peak, which is set to 1. According to the stoichiometry of the molecules one would expect the same areas for the $CF_3$ peak, the CO peak and the CC/CH peak. More precisely, because of the attenuation of the signal of the CO and CC/CH peaks due to the fluorinated chains the area of the CO, CC/CH peaks would be expected to be slightly smaller than the one of the $CF_3$ peak. This consideration leads to the conclusion that the surface of $F_nH_2$-PS film on Ni—V, cleaned in an $O_2$ gas plasma (FIG. 3a), is contaminated by at least 1.1 additional impurity carbon atoms per molecule and the surface of the of $F_nH_2$-PS film on Ni, cleaned by the inorganic washing procedure (FIG. 3b) by at least 4.6 additional impurity carbon atoms per molecule, assigned to carbon hydride, carbon oxide and carbon hydroxide containing species.

Figure 4:
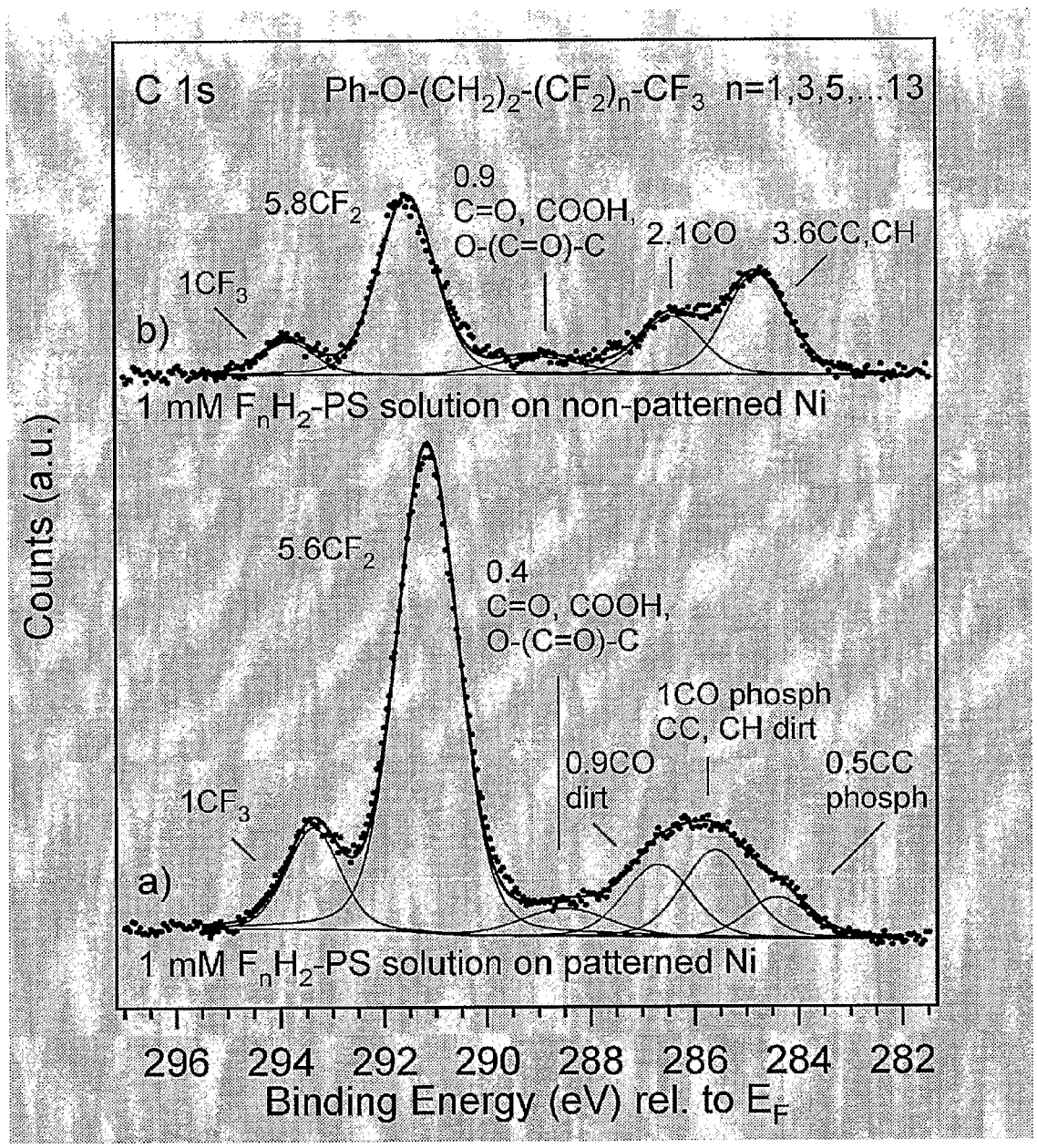
FIG. 4 shows the XPS C 1s spectra together with a Voigt function deconvolutions of a very pure monomolecular $F_nH_2$-PS film deposited on an electroplated non-patterned and patterned Ni sheets.

FIG. 4 shows the XPS C 1s spectra together with Voigt function deconvolutions of a very pure monomolecular $F_nH_2$-PS film deposited on electroplated non-patterned and patterned Ni sheets (first cleaned in an aqueous solution comprising MilliQwater, hydrogen peroxide and ammonia for 10 min at 80° C.).

More specifically, FIG. 4 compares (a) the spectrum of an $F_nH_2$-PS film on a patterned surface (line pattern: separation 260 nm, width 150 nm, height 100 nm) with (b) that of a film on a non-patterned surface.

The $F_nH_2$-PS film thickness on the patterned surface of FIG. 4a 90° to the substrate plane can be estimated to be 30-40 Å. The spectra of FIGS. 3b and 4b are similar. However, due the high polarity of the phosphate unit all $F_nH_2$-PS related peaks of FIG. 4a) appear at approx. 0.4-0.5 eV lower binding energies compared to those of FIGS. 3 and 4b). These shifts lead to six Voigt function peaks in FIG. 4a instead of five observed in FIGS. 3 and 4b. The six Voigt function peaks can be assigned to the $CF_3$ end groups of the $F_nH_2$-PS molecules (at 293.3 eV), to the $CF_2$ chain of the $F_nH_2$-PS molecules (291.1 eV), to C=O, COOH or O—(C=O)—C containing impurity species (at 288.5 eV), to CO containing impurity species (at 286.7 eV), to the CO group of the $F_nH_2$-PS molecules plus CC and CH containing impurity species (at 285.6), and to the CC group of the $F_nH_2$-PS molecules (at 284.4 eV). The C 1s spectrum of FIG. 4a shows a very pure film which is contaminated by approx. 1.3 carbon atoms per molecule assigned to carbon containing impurity species. The reason for the small area of the peak assigned to the CC group of the $F_nH_2$-PS molecules of 0.5 C atoms per molecule instead of 1 is certainly due to the attenuation of the signal of the CC peak due to the fluorinated chains. Nevertheless, the observed ratio of fluorinated to non-fluorinated carbon species in FIG. 4a of 2.4 is largest ratio of all observed films.

Figure 5:
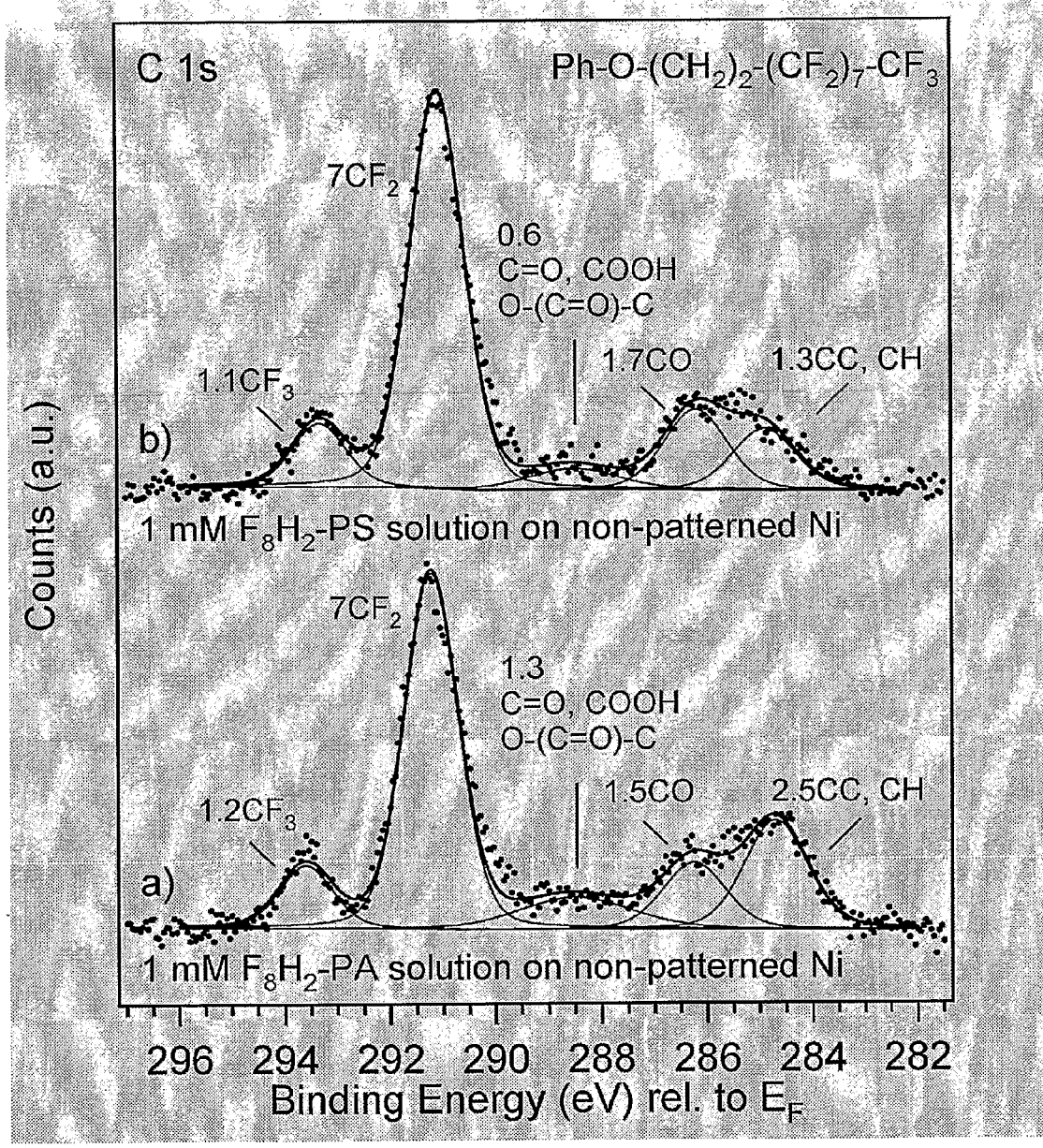
FIG. 5 shows the XPS C 1s spectra together with a Voigt function deconvolutions of a very pure monomolecular (a) $F_8H_2$-PA film and (b) $F_8H_2$-PS film, both deposited on electroplated non-patterned Ni sheets.

FIG. 5 shows the XPS C 1s spectra together with Voigt function deconvolutions of a very pure monomolecular (a) $F_8H_2$-PA film and (b) $F_8H_2$-PS film, both deposited on electroplated non-patterned Ni sheets.

More specifically, FIG. 5 shows two C1s XPS spectra of (a) a $F_8H_2$-PA film and (b) a $F_8H_2$-PS film deposited on non-patterned, electroplated oxidized Ni sheets (cleaned by the organic and washing procedure followed by an oxygen plasma cleaning). The film thicknesses of the two films may be estimated to be 10-16 Å, estimated from the attenuation of the Ni $2p_{3/2}$ signal. Similar to the spectra 3 and 4(b), the deconvolution of the C1s spectra of FIG. 5 leads to five peaks for each spectrum which can be assigned in the same way as already described for FIGS. 3 and 4. As opposed to FIGS. 3 and 4, the spectra of FIG. 5 are normalized against the area of the $CF_2$ peak, which is set to 7. The binding energies of the observed peaks are the following: Respectively for spectrum a and b, the $CF_3$ peak positioned at 293.6 and 293.3 eV and the $CF_2$ peak at 291.2 and 291.1 eV. In case of both spectra the C=O, COOH or O—(C=O)—C impurity peak is resolved at 288.5. The CO peaks of the two phosphoric acid molecules plus CO containing impurity species are resolved at 286.3 and 286.2 for spectrum a and b, respectively, and the ones of the CC groups of the two phosphoric acid molecules plus CC or CH containing impurity species are resolved at 284.7 and 284.9 eV for spectrum a and b, respectively.

According to the stoichiometry of both the $F_8H_2$-PA and the $F_8H_2$-PS molecule the expected $CF_3/CF_2/CO/CC$ area ratio of the different peaks is 1/7/1/1 for pure, adsorbed films, which are not contaminated by additional carbon containing impurity species. As a result of the fits the observed $CF_3/CF_2/$CO/CC area ratios are 1.2/7/1.5/2.5 in the case of the $F_8H_2$-PA film of FIG. 5(a) and 1.1/7/1.7/1.3 in the case of the $F_8H_2$-PS film of FIG. 5(b). Additionally, the surfaces are covered by 1.3 (FIG. 5(a)) and 0.6 (FIG. 5(b)) carbon atoms either having a double bond to one oxygen atom and/or are bound to more than one oxygen atoms (see C=O, COOH or O—(C=O)—C impurity peaks). Therefore the surface of the $F_8H_2$-PA film on Ni of FIG. 5a) is contaminated by at least 3.3 additional carbon atoms per molecule and the surface of the $F_8H_2$-PS film on Ni of FIG. 5b) by at least 1.6 additional carbon atoms per molecule, assigned to carbon containing impurity species.

Generally, all fluorinated alkyl phosphate films observed here are much less contaminated by organic impurities than observed for the more usual fluorinated alkyl silane anti-sticking films [6,7]. Additionally, all fluorinated alkyl phosphate covered surfaces (see FIGS. 3, 4 and 5) are characterized by larger ratios of fluorinated to non-fluorinated carbon species than observed for the fluorinated alkyl silane covered surfaces [6,7].

FIG. 6 shows the XPS C 1s spectra of a very pure monomolecular (a) $H_{12}$-PA film and of (b) $H_8$-PA films deposited on 2000 Å Ni on a Si(100) wafers. The non-fluorinated model compounds $H_8$-PA and $H_{12}$-PA have been prepared on 200 nm thick Ni films thermally deposited onto Si(100) wafers in order to demonstrate that very pure self-assembling monolayer films of non-fluorinated phosphoric or phosphonic acids (the latter without an oxygen bridge between the phosphorus atom and the alkyl chain) may be deposited on clean oxidized Ni films from aqueous solutions. The film thicknesses of the two different films on oxidized Ni surfaces are very similar and can be estimated to be 11.6±2.4 Å. FIG. 6 demonstrates the high purity of the films on the basis of XPS C1s spectra. Despite the main peak in each spectrum at 284.7-284.8 eV assigned to the respective alkyl chain just small peaks can be resolved which can be partly assigned to CO, C=O, COOH or C—(C=O)—C containing impurity species. The carbon impurity portions on the two sample surfaces are less than 13% of the of the carbon atoms adsorbed on each surface. This high purity of the films is the result of the very efficient cleaning procedure and sample preparation technique.

Since the phosphorous atoms of the different molecules are certainly the frontier atoms at the interface between substrate and the adsorbed films binding mechanisms between the molecules and the respective surface can be most efficiently studied by the interpretation of the positions of the P 2p levels.

FIGS. 7(a) and (b) show respectively the XPS P 2p spectra together with Voigt function deconvolutions of very pure monomolecular $H_8$-PA and $H_{12}$-PA films deposited on 2000 Å Ni film on a Si (100) wafer. FIGS. 7(c) and (d) show respectively the XPS P 2p spectra together with Voigt function deconvolutions of a $F_nH_2$-PS film deposited on electroplated non-patterned and patterned Ni sheets.

Figure 7:
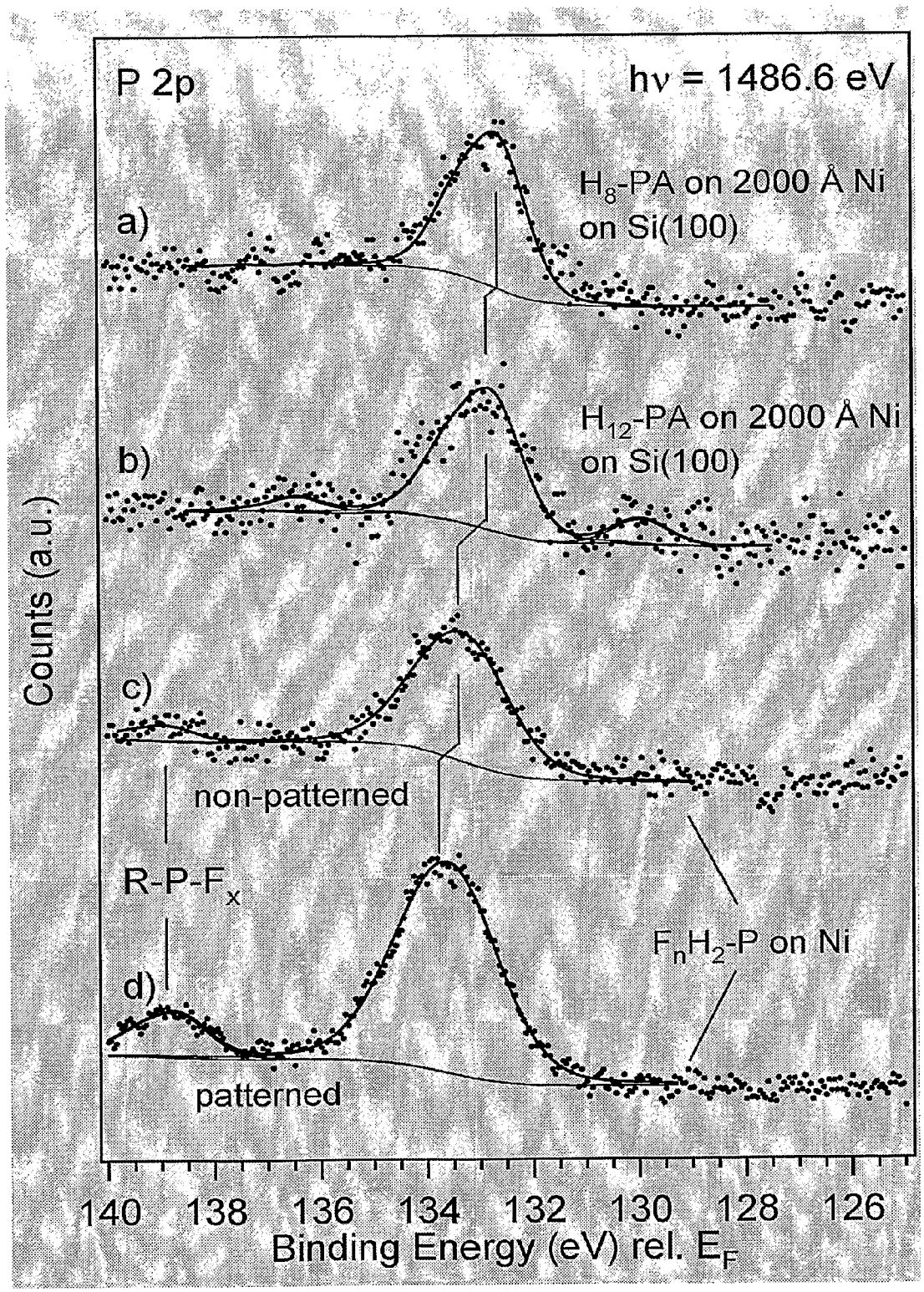
FIGS. 7(a) and (b) show the XPS P 2p spectra of very pure monomolecular $H_8$-PA and $H_{12}$-PA films deposited on 2000 Å Ni film on a Si (100) wafer.
FIGS. 7(c) and (d) show the XPS P 2p spectra together with a Voigt function deconvolutions of a $F_nH_2$-PS film deposited on electroplated non-patterned and patterned Ni sheets.

FIG. 7 thus compares the P 2p spectra of $H_8$-PA and $H_{12}$-PA prepared on 2000 Å Ni on Si(100) wafers with $F_nH_2$-PS films on non-patterned and patterned electroplated Ni sheets. The main peaks of all spectra can be assigned to phosphate groups, phosphoric acid groups or phosphonic acid groups of the adsorbed films. The spin-orbit splits of the P 2p peaks of 0.84 eV have been considered in all de-convolutions of FIG. 7. The spectrum of the $H_8$-PA film of FIG. 7a) contains a sharp structure at 132.7 eV having a FWHM of 1.2 eV without any satellite features demonstrating a very well defined chemical environment of the phosphonic acid group. The main peak of the $H_{12}$-PA film (FIG. 7(b)) is shifted with 0.2 eV to higher binding energies certainly due to the additional oxygen atom bound between the phosphorous atom and the alkyl chain. Although this feature is with FWHM=1.3 eV quite small. The spectrum contains two satellite structures, which might belong to phosphorous containing impurities. One other explanation for the origin of the three resolved peaks of FIG. 7b is that different bond mechanisms between the phosphate group and the Ni surface could lead to different chemically shifted P 2p peaks. Textor et al. [11] postulated from TOF-SIMS measurements on octadecylphosphoric acids on oxidized Ta surfaces the existence of two different phosphate/Ti species—the monodentate and the bidentate coordination. However, the expected chemical shifts due to these different bond mechanisms would be too small to explain the very pronounced observed separation of approx. 3 eV between the individual peaks in the P 2p spectrum. This explanation is therefore quite improbable.

The shift to higher binding energies of the P 2p main peak when going from FIG. 7a to 7b continues in the sequence from 7b to 7d via 7c. The P 2p peaks of the $F_nH_2$-PS molecules are lying at 133.4 eV and 133.7 eV binding energies with FWHMs of 1.8 and 2 eV observed for the films on a non-patterned (FIG. 7c) and patterned surface (FIG. 7d), respectively. These shifts together with the observed broad line widths are probably due to the fact that the $F_nH_2$-PS films are composed by a mixture of different molecules with one or two alkyl chains bound to the phosphate group. One explanation for both the observed shifts and the broad features is related to chemical shifts: When the phosphate group is bound to one Ni atom and two alkyl chains the Ni 2p peak should appear at higher binding energies than observed when the phosphate is bound to two Ni atoms and one alkyl chain because of the lower electro negativity of the nickel atom compared to carbon atom. A second explanation is related to the dipole in the interface between the phosphate molecule and Ni surface. Here, the dipole is weaker when the phosphate unit is bound to one Ni atoms instead of two, which also results in a shift of the Ni 2p peak to higher binding energies when the phosphate unit is surrounded by one Ni atom and two alkyl chains instead of two Ni atoms and one alkyl chain. According to the two different explanations the mixture of one and two alkyl chains leads to the observed broader peaks, which are additionally shifted to higher binding energies compared to the P 2p peak of a spectrum of the phosphate in phosphoric acid with one single alkyl chain (FIG. (7b)). The satellite structures observed in the spectra shown in FIGS. (7c) and (7d) are certainly due to phosphorous containing impurities.

In summary, the XPS results disclosed in FIGS. 3-7 demonstrate that fluorinated mono- and dialkyl phosphate diammonium salts ($F_nH_2$-PS), heptadecafluoro(1H,1H,2H,2H-tetrahydro)decyl-monophosphate ($F_8H_2$-PS), heptadecafluoro(1H,1H,2H,2H-tetrahydro)decyl-monophosphoric acid ($F_8H_2$-PA), 1-octylphosphonic acids ($H_8$-PA) and monododecyl ester phosphoric acids ($H_{12}$-PA) form very pure films on oxidised Ni or Ni—V substrate surfaces having film thicknesses with monomolecular diameters.

Additionally, the Ni substrate is surprisingly only slightly covered by contaminated hydrocarbons from the air environment, demonstrating both a very adequate sample cleaning and a strong linkage of the phosphate groups to the Ni surface.

The application of different derivatives of alkyl phosphoric acids such as phosphoric acids, phosphate salts, phosphonic acids and phosphonic acid salts are shown to result in strong adsorbate/substrate linkages.

Finally, all observed surfaces covered by fluorinated alkyl phosphoric acids (see FIGS. 3, 4 and 5) are characterized by large ratios of fluorinated to non-fluorinated carbon species inferring that favourable anti-adhesion properties exist in all these surfaces.

AFM Results

The quality of imprints with stamps covered by different films of fluorinated alkyl phosphoric acid derivatives were investigated using atomic force microscopy (AFM) in the tapping mode.

Figure 8A:
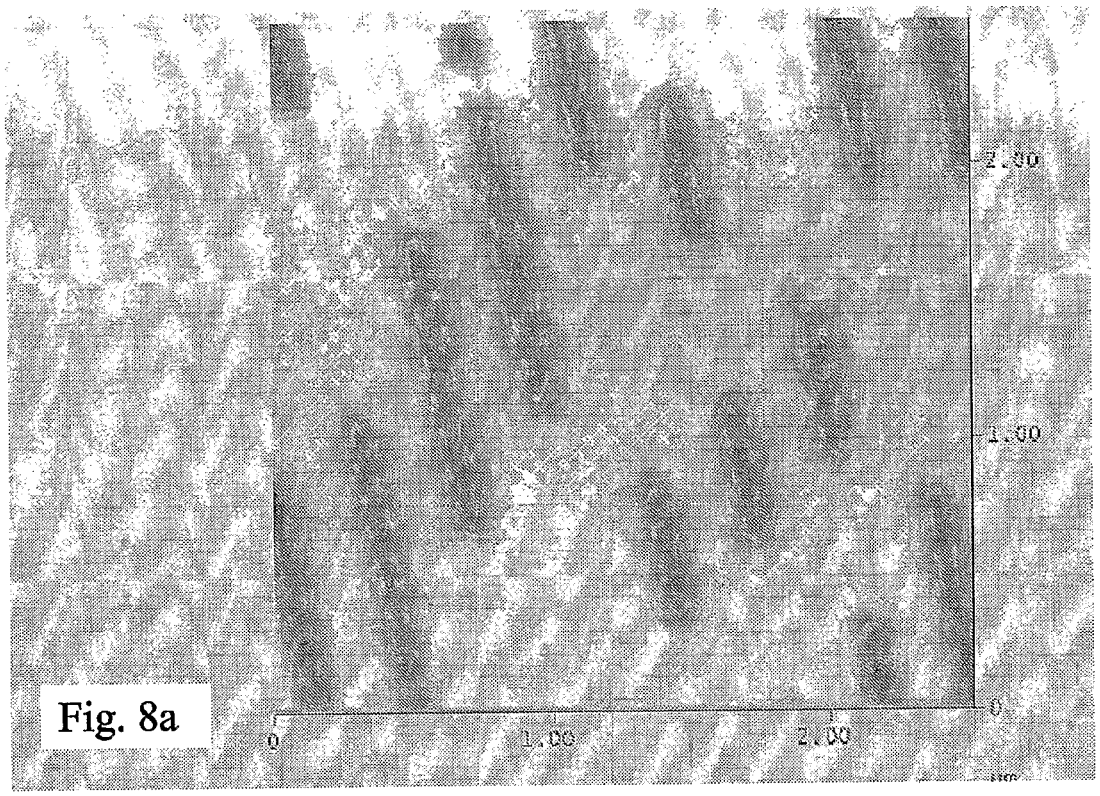
Figure 8B:
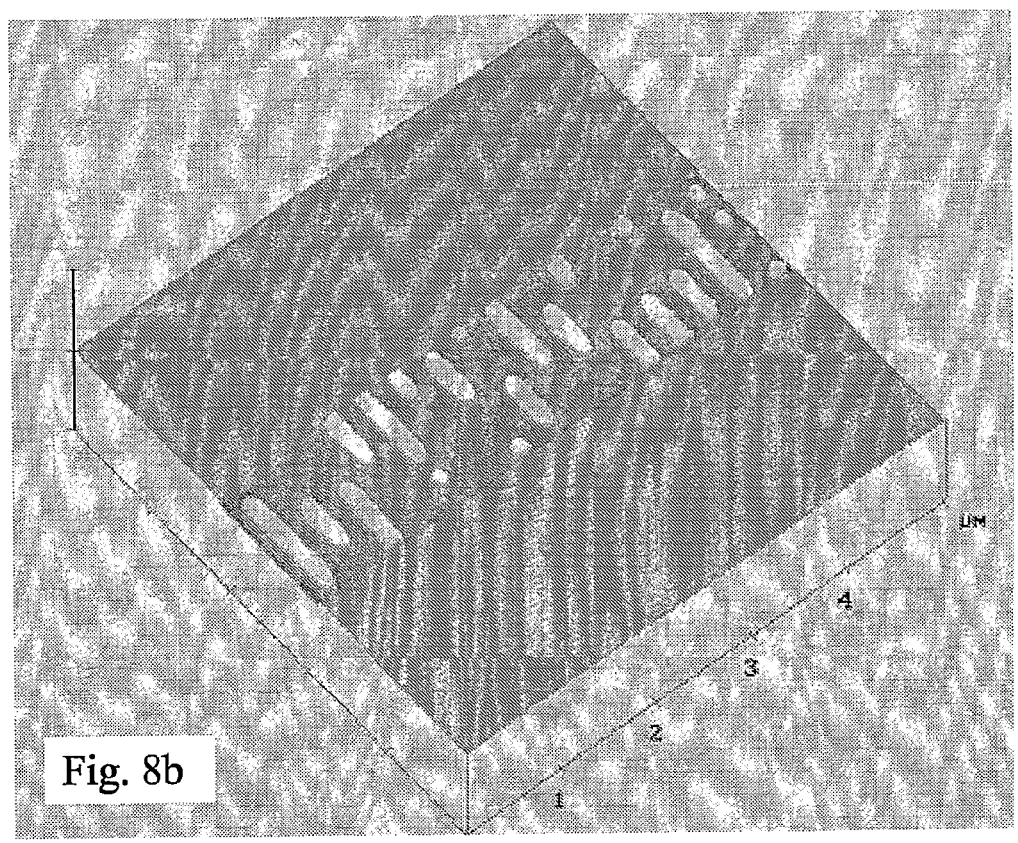

FIG. 8 shows the AFM image of the third imprint of (a) a blue-ray DVD stamp in PMMA50 kC6 from Micro Resist Technology GmBR Germany, (b) the same blue-ray DVD stamp after 5 imprints with the parameters of FIG. 8a. *The stamp was covered with an $F_nH_2$-PA anti-sticking layer.* Pit dimensions: 150 nm track width, 100 nm height and 320 nm track pitch perpendicular to the writing direction. The imprint was performed at 160° C. and 70 bar for 20 sec; the release temperature was 100° C.

Figure 9:
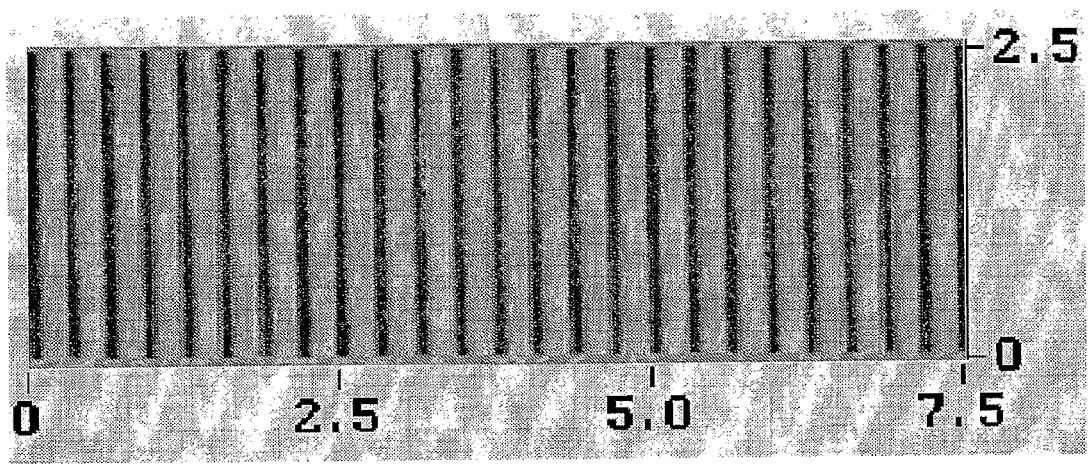
FIG. 9 shows the AFM image of an imprint in mrl 6000.1 on PMMA 50 kC6 from Micro Resist Technology GmBH, Germany.

FIG. 9 shows the AFM image of an imprint in mrl 6000.1 on PMMA 50 kC6 from Micro Resist Technology GmBH, Germany. The stamp was covered with a $F_nH_2$-PA anti-sticking layer. Line structure dimensions were 230 nm separation and 200 nm height. The imprint was performed at 65° C., 8 bar for 60 sec followed by 40 bar for 120 sec.

Figure 10:
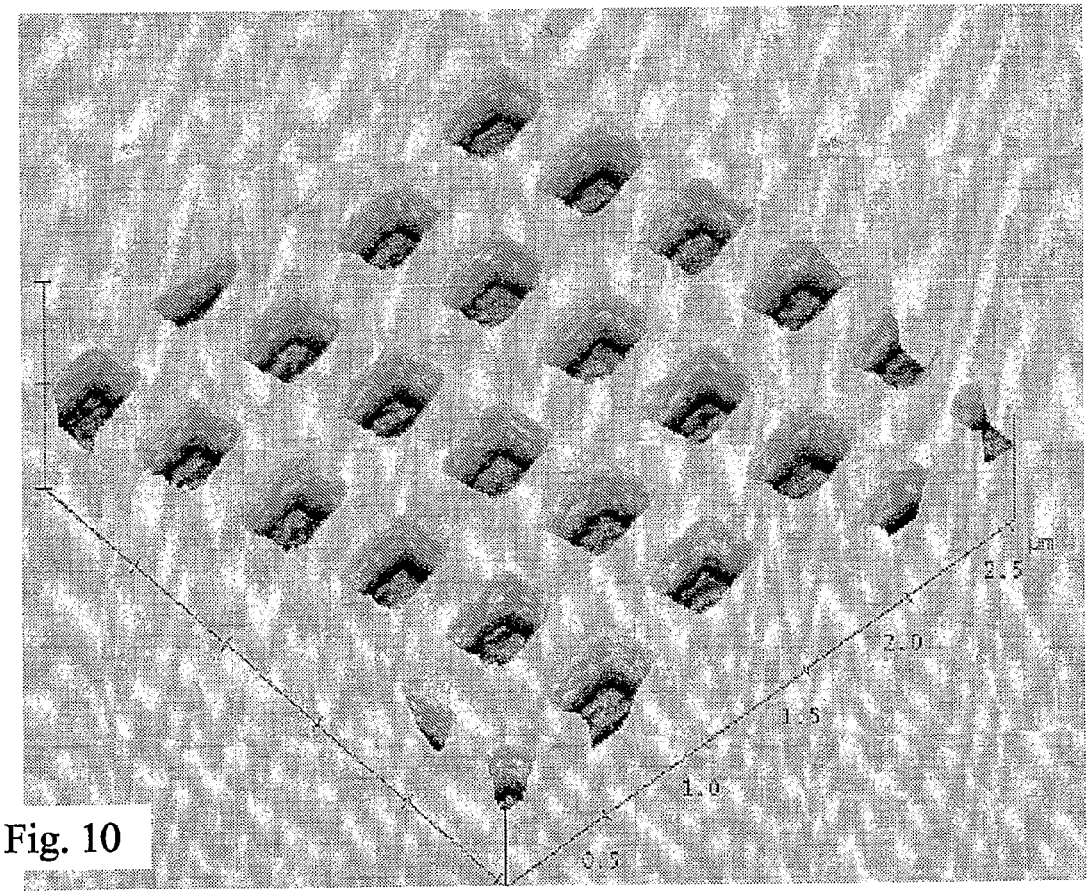
FIG. 10 shows the AFM image of an imprint of a test structure in an UV-curable resist (NIP-K28 from Zen Photonics CO., LTD, South Korea)

FIG. 10 shows the AFM image of an imprint of a test structure in an UV-curable resist (NIP-K28 from Zen Photonics CO., LTD, South Korea). The stamp was covered with a $F_nH_2$-PA anti-sticking layer. The imprint parameters were: P=8 bar, T=20 sec; afterwards curing with UV-light exposure. The smallest features are 250 nm in diameter.

Figure 11:
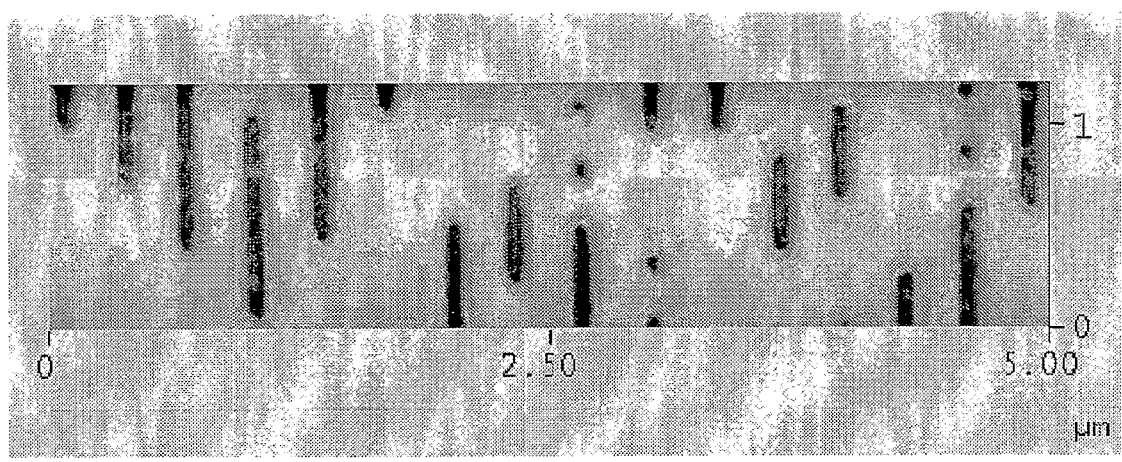
FIG. 11 shows the AFM image of the tenth imprint of a blue-ray DVD stamp in PMMA 50 kA5 from MicroChem Corp., USA.

FIG. 11 shows the AFM image of the tenth imprint of a blue-ray DVD stamp in PMMA 50 kA5 from MicroChem Corp., USA. The stamp was covered with an $F_8H_2$-PA anti-sticking layer. The pit dimensions were: 150 nm track width, 100 nm height and 320 nm track pitch perpendicular to the writing direction. The imprint was performed at 145° C. and 50 bar for 60 sec; the release temperature was 97° C.)

Summarizing, FIGS. 8-11 show AFM images which characterize the quality of different imprint results carried out with differently patterned Ni and Ni—V stamps, which are covered by either $F_nH_2$-PS or $F_8H_2$-PA anti-sticking layers. The imprints were carried out in different resist materials using different imprint process parameters (see separate FIG. notations above).

FIGS. 8-11 disclose that imprints of patterns with feature sizes down to 100 nm may be consistently reproduced. Several $F_8H_2$-PS covered oxidized Ni stamps with structure sizes down to 100 nm were found to be successfully imprinted at least 50 times without degradation of the imprint quality.

The wet-chemical deposition of fluorinated alkyl phosphoric acid derivatives as anti-sticking films may therefore be regarded as a potential alternative to the more common CVD (chemical vapour deposition)-based silane deposition, especially for industrial purposes.

Experimental

The examples or Figs described in both the experimental and the detailed description illustrate the invention. These examples are present to exemplify the invention; they are not, however, intended to limit in any way the invention as covered by the claims.

I. General Description of Possible Deposition Methods of Phosphoric Acid-Based Anti-Sticking Layers a. Precleaning the Stamp Generally, different suitable stamp cleaning and preparation techniques may be used to prepare high quality anti-adhesive monolayers. The samples can be washed electrochemically within a water-based solution. Here, an electric current is led through the process solution by switching on a current source. This results in hydrogen bubbles at the cathode and oxygen bubbles at the anode. If the stamp is connected to the cathode of a current source via the sample holder, produced hydrogen bubbles will break-free from the Ni surface carrying contaminations. If the stamp is connected to the anode of a current source via the sample holder, produced oxygen bubbles will anodically passivate and additionally clean the surface. The processes are carried out for 5 to 600 sec at 0-10 Ampere at different temperatures between 20 and 100° C. The samples must be washed using organic solvents (such as trichloroethylene, acetone and isopropanol or with other organic solvents) and/or washed using an inorganic procedure involving water, hydrogen peroxide, ammonia or other inorganic reagents and/or washed in different water-based solutions and/or cleaned using different plasmas (such as oxygen plasma, a noble gas plasma, hydrogen plasma) and/or cleaned using ozone treatment. The wet-chemical cleaning of the stamps may be performed at different temperatures (from about 20 to about 100° C.) optionally supplemented by treatment in an ultrasonic bath. In between the last cleaning step and the deposition treatment described in (b), the stamps are kept exposed to an inert gas or covered by an inert liquid.

b. Deposition of the Anti-Adhesive Layer

The anti-adhesive layer comprising a fluorinated alkyl phosphoric acid derivative or a fluorinated alkyl poly-phosphoric acid derivative, may be prepared/deposited either from (i) a solution, (ii) from the vapour phase or (iii) from a supercritical fluid phase.

In the first alternative (i), the stamp is exposed to water-based, alkaline, acidic and/or organic phosphoric acid solutions or its corresponding salts, having different concentrations (from about 0.1 mM to about 5 mM), for different incubation times (of at least 30 minutes), optionally supplemented by ultrasonic treatment and at different temperatures (from about 20 to about 100° C.). Alternatively, the anti-adhesive layer will be deposited electrochemically onto the Ni stamps with the help of an electric current flowing through the phosphoric acid solution. During the deposition the stamp should be connected to the anode of the current source in order to advance the deposition process. Afterwards the stamp will be rinsed with inert liquids, optionally supplemented by ultrasonic treatment and/or dried in a stream of an inert gas. The reason may be to connect the electrochemical deposition of the anti-sticking molecules to the electrochemical cleaning of the stamps. So you have one nice process. This would also be a way to remove the undesirable OH groups from the Ni surface (when you apply a plus on the stamp, you will remove the hydrogen from the stamp with oxygen ions).

In the second case (ii), the stamp is placed in a reaction chamber for chemical vapour deposition (CVD). The chamber should have different base pressures (less than 1 bar) and the deposition of the phosphoric acid molecules by sublimation or evaporation of the molecules should be performed under different reaction pressures (from about 1 bar to $10^{-8}$ mbar) at different stamp temperatures (from about 20 to about 300° C.) at different temperatures of the phosphoric acid molecules (from about 100 to about 350° C.), with different deposition rates (from about 0.01 nm/min to about 2 nm/min) and for different reaction times (from about 1 min to about 2 hours). It has been found that preparation of fluorinated alkyl phosphate molecules from aqueous solutions may not be optimum, because it generates thermally unstable $Ni(OH)_2$ and NiO—OH groups on the surface of the mold. A preparation technique with the help of vacuum CVD on a sample heated to temperatures higher than the reduction temperature of Ni hydroxides is therefore proposed. In order to obtain an oxide layer on the Ni surface, but no residues of OH, chemical vapor deposition of fluorinated alkyl phosphate molecules is preferably performed at a temperature of at least 120° C., but not more than 250° C. An even more preferred temperature range is 150-200° C. The CVD process should be performed under high vacuum, or even ultra high vacuum conditions between $10^{-8}$ and $10^{-11}$ mbar. Since the process relates to deposition of a self-assembly monolayer, the process is finished when the intended surface is covered. The actual time will be dependent on reaction pressure.

In one working example, an anti-sticking layer was grown on a metal mold by placing the mold in a CVD chamber, and subjecting it to a vacuum reaction pressure of about $10^{-5}$ mbar, or at least between $10^{-3}$ to $10^{-6}$ mbar. The mold was heated to about 150° C., and a powder source containing the fluorinated alkyl phosphor-based compound was heated to about 230° C. The phosphor-based compound in the powder source may comprise phosphonic acids, phosphonic acids, phosphonates, phosphonate salts, phosphonates or phosphonate salts. Application of a complete surface may in reality take about 10-20 minutes, but a preset process time which is clearly longer is preferably applied, such as 30 minutes.

In the third case (iii), the stamp is exposed to a phosphoric acid solution (for example, with carbon dioxide as a solvent) having different concentrations (from about 0.1 mM to about 5 mM) and placed within a pressure cell. The phosphoric acid solution is compressed (to between about 100 bar to about 1000 bar) and the deposition of the phosphoric acid molecules from the supercritical fluid phase onto the stamp surface is performed under different reaction pressures (from about 100 bar to about 1000 bar), at different stamp temperatures (from about 20° C. to about 300° C.), for different reaction times (from about 10 sec to about 1 hour). Afterwards the stamp is rinsed with inert liquids optionally supplemented by ultrasonic treatment, and/or dried in a stream of an inert gas with or without ultrasonic treatment.

Additionally, also electro-plating of the phosphate molecules can be tested, and/or mixing of acids into the aqueous solution removing hydroxides from the Ni surface.

c. After-Treatment

After the deposition of the anti-adhesive layer, the stamps may be baked at different temperatures (from about 20° C. to about 300° C.), for different times and under different pressures in an oven on a hot plate.

II. Specific Description of the Experiments

Thin films of a blend of fluorinated mono- and dialkyl phosphate di-ammonium salts ($F_nH_2$-PS), fluorinated mono-alkyl phosphoric acids ($F_8H_2$-PA), and mono-alkyl phosphate di-ammonium salts ($F_8H_2$-PS) were deposited from aqueous solutions onto surfaces of oxidized polycrystalline nickel stamps. X-ray photoelectron spectroscopy (XPS) was performed in order to characterize the film properties, i.e the chemical composition, purity, and thickness.

As substrates for the XPS investigation of the $F_nH_2$-PS, the $F_8H_2$-PA and the $F_8H_2$-PS films on oxidised nickel, pieces of non-patterned and patterned regions of an electroplated, polycrystalline Ni stamp were used.

$F_nH_2$-PS (trade name Zonyl FSP) is commercially available from DuPont and is a mixture of fluorinated mono- and dialkyl phosphate di-ammonium salts with different chain lengths. The chemical structures are as follows:

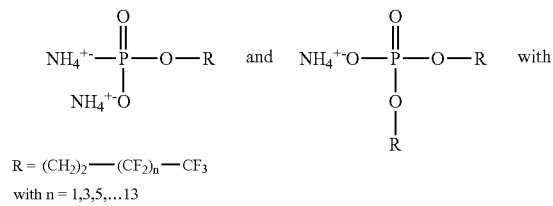

R = (CH$_2$)$_2$—(CF$_2$)$_n$—CF$_3$
with n = 1,3,5,...13

The pattern of the Ni stamp consists of lines having a separation of 260 nm, a width of 150 nm, and a height of 100 nm, defined by e-beam lithography.

The Ni samples were cleaned by standard organic ultra-sonic bath procedures including trichloroethylene, acetone and isopropanol followed by an inorganic cleaning procedure, where the samples have been exposed to a mixture of MilliQwater, hydrogen peroxide and ammonia for 10 min at 80° C., and washed with MilliQwater.

The samples were transferred to a 1 mM F$_n$H$_2$-PS solution in MilliQwater without any exposition to air i.e. the surfaces were covered by thin water films during the whole sample transfer in air.

Additionally, non-patterned Ni stamps comprising Ni—V surfaces were used in the XPS investigation.

The Ni—V samples were cleaned by standard organic ultra-sonic bath procedures as described above followed by an oxygen plasma cleaning. During the whole transfer of these samples from the vacuum plasma chamber into a 1 mM F$_n$H$_2$-PS solution in MilliQwater the samples were exposed by a gentle stream of N$_2$ gas. The incubation time in the F$_n$H$_2$-PS water solution was approx. 12 hours. Afterwards the samples were rinsed with MilliQwater, dried in a gentle stream of Nitrogen, and annealed on a hotplate or in an oven at 150° C. for 2 h, in order to strengthen the bonds between the phosphate film and the surface [17].

Additionally, pristine electroplated, polycrystalline Ni plates were used in the XPS investigation. The samples were first cleaned by the same organic and inorganic washing procedure as described above.

Furthermore, the chemical structures of the additionally investigated fluorinated alkyl phosphoric acids derivates F$_8$H$_2$-PS and F$_8$H$_2$-PA are as follows:

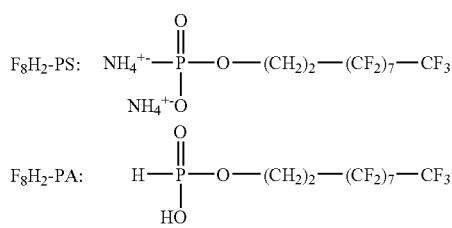

The oxidized Ni stamps were cleaned as described above either by an organic and inorganic washing procedure or by an organic washing procedure followed by O$_2$ plasma treatment and transferred into the 1 mM F$_8$H$_2$-PS or the F$_8$H$_2$-PA solutions in MilliQwater without or with minimal air exposition of the surfaces. The incubation time was approx. 12 hours. Afterwards the samples were been rinsed with MilliQwater, dried in a nitrogen gas stream, and annealed at 150° C. for 2 h, as described above.

The non-fluorinated model compounds H$_8$-PA and H$_{12}$-PA were prepared onto 200 nm thick Ni films thermally deposited onto silicon wafers. The chemicals are commercially available from Lancaster synthesis UK. These model compounds have chemical structures as follows:

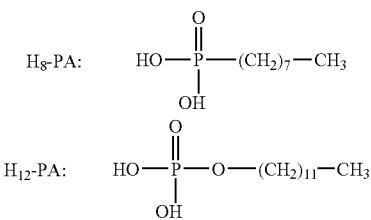

Directly before Ni deposition a 1 nm thick Ti film was deposited onto the silicon surface working as an adhesion promoter. The samples were cleaned by an organic and inorganic washing procedure described above and transferred into a 1 mM solution in MilliQwater without exposition of the surface to air. The incubation time was approx. 10 hours. Afterwards the samples were rinsed with MilliQwater for 5 min and dried in a gentle stream of Nitrogen.

The XPS measurements were performed using a multi-chamber Scienta ESCA200 spectrometer with a base pressure less than 2×10$^{-10}$ mbar employing monochromatic Al K$_\alpha$ X-rays at hv=1486.6 eV. The experimental conditions were such that the Full Width of Half Maximum (FWM) of the Au 4f$_{7/2}$ peak was approx. 1 eV. The spectra were deconvoluted by Voigt functions having 80% Gaussian and 20% Lorentzian contribution. The FWHMs of the F$_n$H$_2$-PS, F$_8$H$_2$-PA, F$_8$H$_2$-PS, H$_8$-PA and H$_{12}$-PA related peaks are 1.2-1.3 eV the FWHMS of the impurity related peaks is 1.3-2 eV. As background, the Shirley background has been used. The different peaks in the spectra were assigned with the help of references [20-23]. For determination of the atomic ratios of the adsorbed molecules each Voigt peak was divided by the particular sensitivity factor based on the photoelectric cross-sections of Al K$_\alpha$ radiation and on the transmission functions of the used hemispherical analyser [22]. The thicknesses of the different adsorbed films were determined with the help of both the electron mean free paths of Vogt et al. and those of Clark and Thomas [24,25].

Imprinting

Imprinting was performed with differently patterned Ni and Ni—V stamps covered by F$_n$H$_2$-PS and F$_8$H$_2$-PA anti-sticking films. All stamps have a size of 4 inch. The imprints were carried out using an Obducat 4 inch imprint machine with different resist materials, using different process parameters.

Atomic force microscopy (AFM) in the tapping mode with the help of a NanoScope IIIa microscope from Digital Instruments was carried out to investigate both the imprint results and the stamps after performed imprint.

REFERENCES

1. S. Y. Chou, P. R., P. R. Krauss, P. J. Renstrom, Appl. Phys. Lett. 67 (1995) 3114.
2. B. Heidari, I. Maximov, L. Montelius, J. Vac. Sci. Technol. B 18 (2000) 3557.
3. L. Montelius, B. Heidari, M. Graczyk, I. Maximov, E-L. Sarwe, T. G. I. Ling, Microelectron. Eng. 35 (2000), 521.
4. R. W. Jaszewski, H. Schift, P. Gröning, G. Margaritondo, Microelectron. Eng. 35 (1997) 381.

5. M. Beck, M. Graczyk, I. Maximov, E.-L. Sarwe, T. G. I. Ling, L. Montelius, M. Keil, Microelectron. Eng. 61-62 (2002) 441.
6. M. Keil, M. Beck, T. G. I. Ling, M. Graczyk, B. Heidari, L. Montelius, Journ. Vac. Sci. Technol. (2004) in press
7. M. Keil, M. Beck, T. G. I. Ling, M. Graczyk, L. Montelius, B. Heidari, Journ. Vac. Sci. Technol. (2004) in press
8. H. Fukushima, S. Seki, T. Nishikawa, H. Takiguchi, K. Tamada, K. Abe, R. Colorado Jr., M. Graupe, O. E. Shmakova, T. R. Lee, J. Phys. Chem. B 104, (2000) 7417.
9. W. Gao, L. Dickinson, C. Grozinger, F. G. Morin, L. Reven, Langmuir 12 (1996) 6429.
10. D. Brovelli, G. Hähner, L. Ruiz, R. Hofer, G. Kraus, A. Waldner, J. Schlösser, P. Oroszlan, M. Ehrat, N. D. Spencer, Langmuir 15 (1999) 4324.
11. M. Textor, L. Ruiz, R. Hofer, A. Rossi, K. Feldman, G. Hähner, N. D. Spencer, Langmuir 16 (2000) 3257.
12. R. Hofer, M. Textor, N. D. Spencer Langmuir 17 (2001) 4014.
13. G. Hähner, R. Hofer, I. Klingenfuss, Langmuir 17 (2001) 7047.
14. E. S Gawalt, M. J. Avaltroni, N. Koch, J. Schwartz, Langmuir, 17 (2001) 5736.
15. M. J. Pellerite, T. D. Dunnbar, L. D. Boardman, E. J. Wood, J. Phys. Chem. B 107 (2003) 11726.
16. J. S. McNaft, J. M. Morgan, N. Farkas, R. D. Ramsier, T. L. Young, J. Rapp-Cross, M. P. Espe, T. R. Robinson, L. Y. Nelson, Langmuir 19 (2003) 1148.
17. M. D. Towler, N. L. Allan, N. M. Harrison, V. R. Saunders, W. C. Mackrodt, E. Aprá, Phys. Rev. B 50 (1994) 5041.
18. H. H. Kung, "Studies in Surface Science and Catalysis 45: Transition Metal Oxides—Surface Chemistry and Catalysis", Elsevier Science Publishers B.V., Amsterdam 1989.
19. T. G. I. Ling, L. Montelius, M. Keil, M. Beck, Swedish patent SE 0201917-2, International patent application 2004/000567 A1.)
20. D. Briggs and M. M. Seah, "Practical Surface Analysis, Vol. 1", John Willey and Sons, Second Edition 1993.
21. J. F. Moulder, W. F. Stickle, P. E. Sobol, K. D. Bomben, "Handbook of X-ray photoelectron spectroscopy", Edt. by J. Chastain, Perking Elmer Corporation, Eden Prairie, Minn. 1992
22. G. Beamson, D. Briggs, High Resolution XPS of Organic Polymers, Wiley, New York, 1992.
23. K S Kim, R. E. Davis, J. Electr. Spectrosc. Rel Phen. 1 (1973) 251
24. A. D. Vogt, T. Han, T. B. Beebe Jr, Langmuir 13 (1997) 3397
25. D. T. Clark, H. R. Thomas, J. Polym. Sci., Polym. Chem. Ed., 15(1977), 2843
26. J. C. de Jesús et al., Surface Science 397 (1998) 34.
27. A. Galtayries, J. Grimblot, Journ. Electr. Spec. Rel. Phen. 98-99 (1999) 267.
28. M. Keil, M. Beck, T. G. I. Ling, M. Graczyk, L. Montelius, B. Heidari, Journ. Vac. Sci. Technol. B 23 (2005) 575.
29. M. Wang et al., Materials Letters 57 (2003) 2954.
30. M. Saito, Y. Okudaira, W. Oshikawa, Journal of the electrochemical Society 150 (2003) C140.
31. M. Ratzker et al. Plating and Surface Finishing 73 (1986) 74.
32. A. S. M. A. Haseeb et al., Thin Solid Films 283 (1996) 144.
33. E. Valova et al., bourn. Appl. Electrochem. 31 (2001) 1367.
34. C. A Holden et al. IEEE Transaction on Components, Hybrids, and Manufacturing Technology 12 (1989) 58.
35. J.-P. Bonino et al., Journ. Appl. Electrochem. 27 (1997) 1193.
36. D. B. Lewis, G. W. Marshall, Surface and Coatings Technology 78 (1996) 150.
37. Y. Shacham-Diamand, Y. Sverdlov, Microelectronic Engineering 50 (2000) 525.

The invention claimed is:

1. A nano-imprint mold, comprising a base nickel nano-imprint mold having a structured imprint surface and an anti-adhesive layer formed on the imprint surface, which anti-adhesive layer comprises a fluorinated alkyl phosphoric acid derivative or a fluorinated alkyl poly-phosphoric acid derivative, including a phosphorous atom (P) and a substituent group R comprising an alkyl chain, wherein the anti-adhesive layer is bonded directly onto the imprint surface of the base nickel mold, and the substituent group R contains atoms selected from the group consisting of hydrogen (H), carbon (C) and fluorine (F) atoms, with the P atom bonded directly to a $(CF_2)_n$ chain or chains of the substituent group R.

2. The mold according to claim 1, wherein the fluorinated alkyl phosphoric acid derivative or fluorinated alkyl poly-phosphoric acid derivative comprises an alkyl phosphonic acid.

3. The mold according to claim 1, wherein the fluorinated alkyl phosphoric acid derivative or fluorinated alkyl poly-phosphoric acid derivative comprises an alkyl phosphinic acid.

4. The mold according to claim 1, wherein the fluorinated alkyl phosphoric acid derivative or fluorinated alkyl poly-phosphoric acid derivative comprises an alkyl phosphonate or alkyl phosphonate salt.

5. The mold according to claim 1, wherein the fluorinated alkyl phosphoric acid derivative or fluorinated alkyl poly-phosphoric acid derivative comprises an alkyl phosphinate or alkyl phosphinate salt.

6. The mold according to claim 1, wherein the substituent group R is a partly or per-fluorinated aliphatic or aromatic alkyl.

7. The mold according to claim 1, wherein a second substituent group R' is bonded to the P atom.

8. The mold according to claim 1, wherein the substituent group R contains atoms selected only from the group consisting of hydrogen (H), carbon (C) and fluorine (F).

9. The mold according to claim 1, wherein said fluorinated alkyl phosphoric acid derivative or said fluorinated alkyl poly-phosphoric acid derivative is selected from the group consisting of phosphonic acids, phosphinic acids, phosphonates and phosphonate salts, phosphinates and phosphinate salts, or their respective oligomers, such that the phosphorous atom is coupled directly to the alkyl chain.

10. The mold according to claim 1, wherein the base nickel mold is an alloy of nickel and one or more metals.

11. The mold according to claim 1, wherein the imprint surface of the base nickel mold is oxidised.

\* \* \* \* \*